(12) United States Patent
Tzu et al.

(10) Patent No.: US 6,720,116 B1
(45) Date of Patent: Apr. 13, 2004

(54) PROCESS FLOW AND PELLICLE TYPE FOR 157 NM MASK MAKING

(75) Inventors: San-De Tzu, Taipei (TW); Anthony Yen, Austin, TX (US); Chung Hsing Chang, Hsin-Chu (TW); Chen-Hao Hsieh, PingChen (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/339,186

(22) Filed: Jan. 9, 2003

(51) Int. Cl.⁷ .................................................. G03F 9/00
(52) U.S. Cl. ....................................................... 430/5
(58) Field of Search ............................. 430/5; 428/14; 355/75

(56) References Cited

U.S. PATENT DOCUMENTS

| | | | |
|---|---|---|---|
| 5,370,951 A | 12/1994 | Kubota et al. | 430/5 |
| 5,795,684 A | 8/1998 | Troccolo | 430/5 |
| 5,935,733 A | 8/1999 | Scott et al. | 430/5 |
| 5,955,222 A | 9/1999 | Hibbs et al. | 430/5 |
| 6,156,461 A * | 12/2000 | Grenon et al. | 430/5 |
| 6,335,129 B1 * | 1/2002 | Asano et al. | 430/5 |

\* cited by examiner

*Primary Examiner*—Mark F. Huff
*Assistant Examiner*—Saleha Mohamedulla
(74) *Attorney, Agent, or Firm*—George O. Saile; Stephen B. Ackerman

(57) ABSTRACT

A method for forming a photomask and pellicle suitable for use in photolithography with incident electromagnetic radiation in a wavelength range from above 250 nm to below 150 nm. The opaque regions of the photomask are formed directly within a transparent F-doped quartz layer by either gallium ion staining using a focused ion beam (FIB) or by deposition of carbon atoms within trenches formed in the transparent layer, said carbon atom deposition being a result of the interaction of a FIB with styrene molecules. An alignment boundary formed on the resulting mask allows a hard pellicle to be fit directly over it so as to avoid warping.

31 Claims, 6 Drawing Sheets

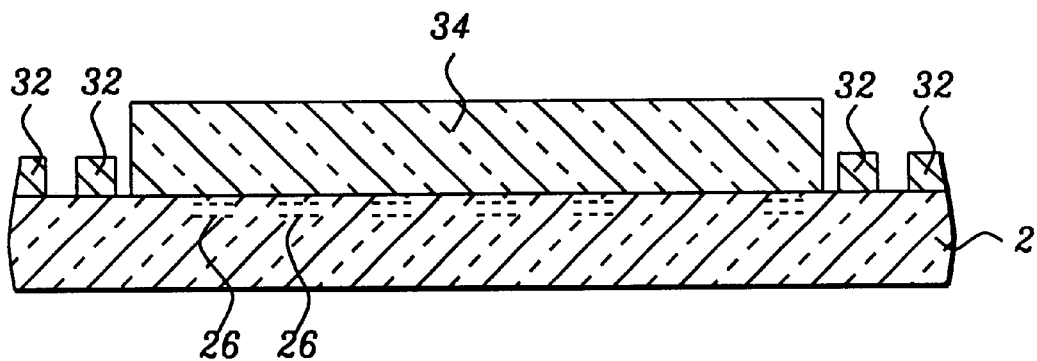
FIG. 10
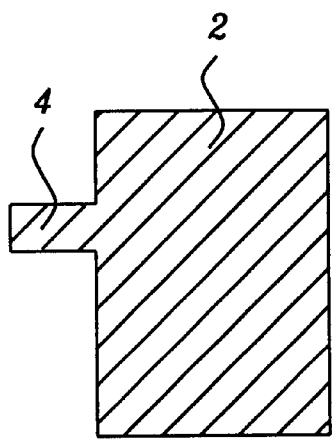
FIG. 11 – Prior Art
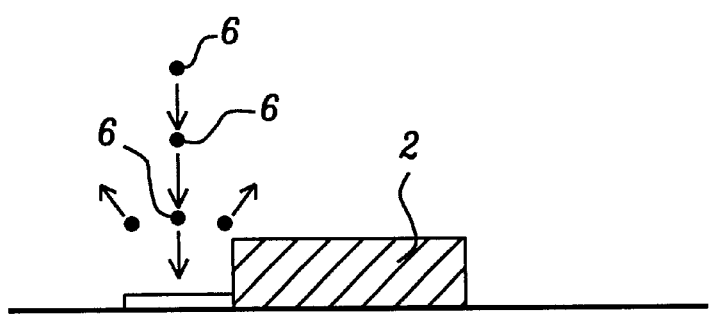
FIG. 12 – Prior Art

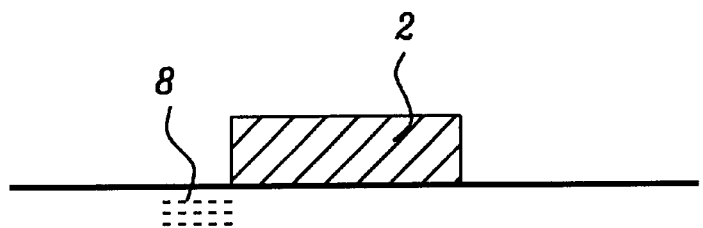
FIG. 13 - Prior Art
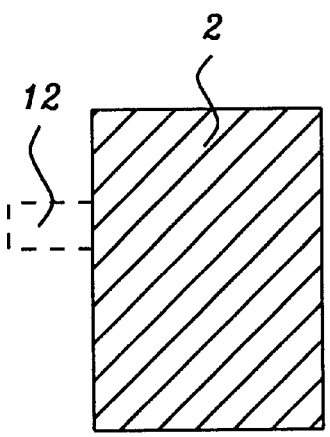
FIG. 14 - Prior Art
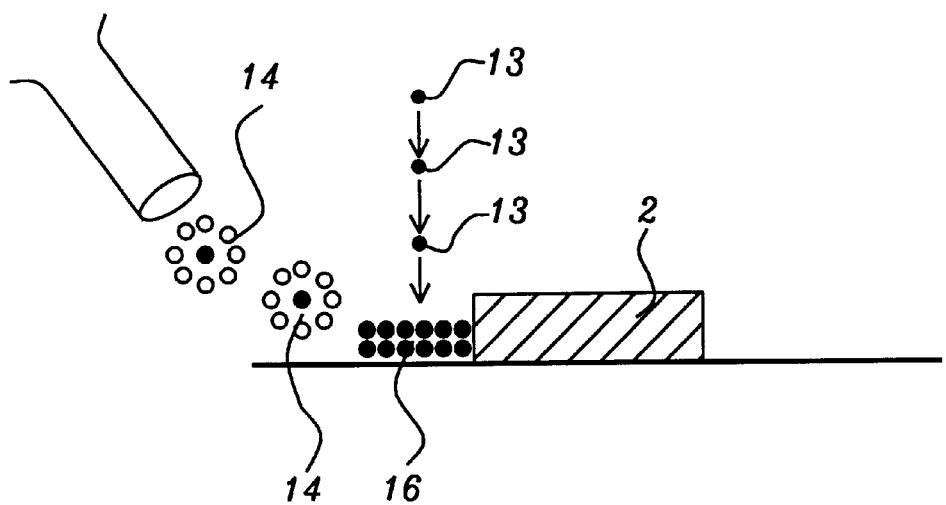
FIG. 15 - Prior Art

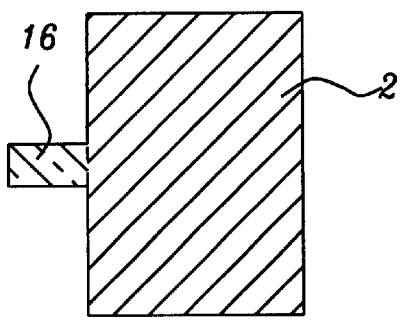
FIG. 16 – Prior Art
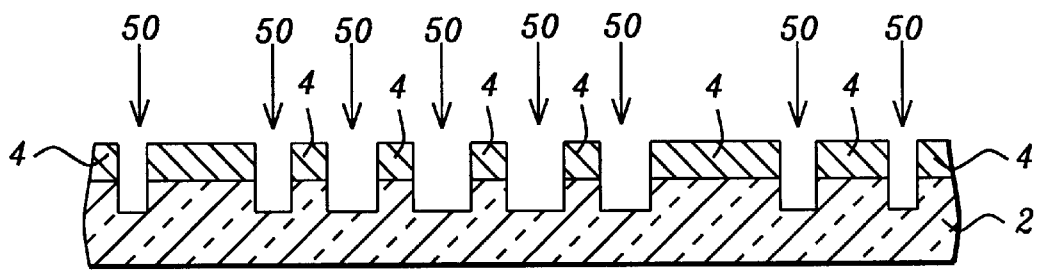
FIG. 17
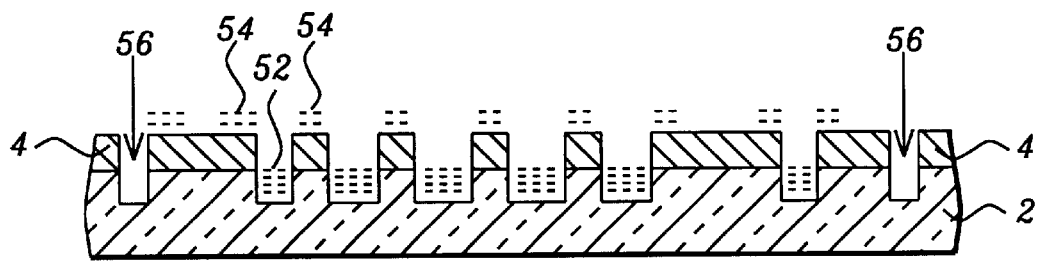
FIG. 18
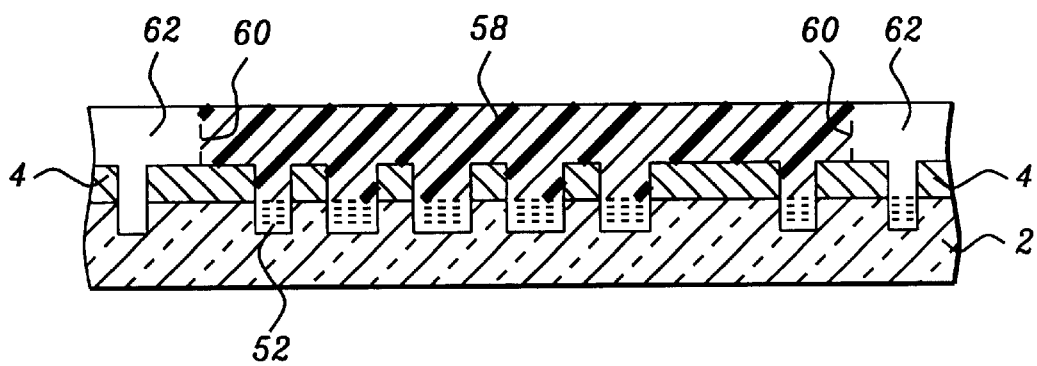
FIG. 19

PROCESS FLOW AND PELLICLE TYPE FOR 157 NM MASK MAKING

BACKGROUND OF THE INVENTION

1. Field of the Invention

This invention relates generally to the field of semiconductor processing and more particularly to a method of fabricating a photolithography mask and pellicle.

2. Description of the Related Art

The fabrication of microelectronic integrated circuitry generally involves the patterning of device structures and layouts on a semiconductor substrate. The accepted practice for creating the requisite pattern is to first form a replica of the pattern on a mask (not necessarily in its final size) and then to transfer the mask pattern to a layer of photoresistive material formed on the semiconductor substrate. The transfer is accomplished by a photolithographic process, shining light of a certain wavelength through the mask and onto the photoresist, using whatever lenses are required to replicate the pattern in its proper size on the photoresist. Once the pattern has been transferred to the photoresist, the photoresist is processed to selectively remove portions of the pattern and expose the substrate below. The substrate, itself, can then be etched by, for example, an anisotropic plasma etch, or otherwise processed as required.

As the dimensions of pattern features become increasingly small, more stringent requirements are placed on the formation of the mask and on methods for preventing mask damage both during fabrication and during use. The process by which the mask is formed is itself quite similar to the process in which the mask is used to pattern the semiconductor substrate. Typically, the mask is formed on a substrate that is transparent to the range of light wavelengths that will be used to pattern the substrate. A layer of opaque material, typically chromium, is formed on the transparent substrate. The opaque layer is then covered by a photoresistive layer and the pattern is traced out in this layer by electron beam lithography. Finally, the photoresist is selectively removed and the opaque layer beneath it is etched away by either isotropic wet etching or anisotropic plasma etching.

It is quite important that the mask so formed be inspected for defects and that those defects be either removed or repaired. This process is implemented by either laser ablation or by the application of a focused ion beam (FIB). Laser ablation, however, can damage the underlying substrate and the Gallium ions used in FIB can stain and dope the substrate.

The completed mask is typically covered by a protective material, called a pellicle. The purpose of the pellicle is to prevent foreign particles from contaminating the mask surface. As shown in FIG. 1, the pellicle is typically a membrane (10) of an organic material that is stretched over the mask (40) on a plastic or metal frame (30) and is raised several millimeters from the mask surface. The pellicle limits the ability to optically (20) inspect the surface of the mask prior to usage. In addition, the pellicle traps gases (50) that can limit the transmission of small wavelength electromagnetic radiation.

Kubota et al. (U.S. Pat. No. 5,370,951) teach a method of forming an improved thin film pellicle that uses a new adhesive to allow the bonding of a group of fluorocarbon membrane materials that have superior resistance to the adverse affects of ultraviolet (UV) radiation in the wavelength range 210–500 nm, commonly used in the photolithography process.

Troccolo (U.S. Pat. No. 5,795,684) teaches a method of forming a photolithographic mask wherein it is the transmissive material that is etched rather than the opaque (absorbing) material and the etched regions are subsequently filled with absorber. The advantages of this method are 1: that the transmissive layer is more robust an permits the use of plasma etching that creates sharply defined etched regions with vertical walls and 2: defects and ion staining can be more easily removed or covered over by the subsequently deposited absorber layer. The method is primarily designed for the fabrication of masks intended for use with light of wavelength down to 193 nm. Light down to 120 nm requires a reflective version of the mask. Following fabrication of the mask, a capping layer, which is a kind of pellicle, can be deposited. This layer is preferably the same material as the transmissive layer and is deposited in a manner to fill all the spaces between the absorbing layer portions.

Scott et al. (U.S. Pat. No. 5,935,733) teaches a method for forming a photolithography mask in which trenches are etched in a transmissive substrate and absorbing material is deposited in those trenches (very much in the manner of Troccolo, above). The fabrication is then planarized and a transmissibe layer is formed on it.

Hibbs et al. (U.S. Pat. No. 5,955,222) teaches a method of forming a rim type phase-shift photolithograph mask suitable for use with radiation in the wavelength range between 190 and 450 nm. A rim-type phase shift mask is one in which there are central openings through which the radiation is transmitted which are surrounded by annular regions containing transmissive material that shifts the phase of the radiation relative to that passing through the central region. When the two rays are combined on the target photoresist, they cancel out possible diffraction patterns that adversely affect the resolution of the pattern transfer process. The method includes the use of a novel "hybrid" photoresist formulation having both positive and negative tone functions depending upon the degree of exposure.

As the size of the smallest features to be transferred by photolithography approach the range of between 70 and 100 nm, the commonly used radiation wavelength of 193 nm becomes too large and a smaller wavelength of 157 nm becomes preferable. Unfortunately, pellicles designed for use with 193 nm radiation are not usable with radiation of 157 nm both because the 157 nm radiation is more strongly absorbed by the pellicle material and because the 157 nm radiation causes radiation damage. For example, air trapped between the pellicle and the mask surface will form ozone which attacks the pellicle membrane material. In addition, Gallium ion stains in the mask substrate produced during mask repair are more troublesome in the context of 157 nm radiation because of reduced transmissivity. It would be advantageous, therefore, to develop a process for forming photolithography masks and their pellicles that would be suitable for use with 157 nm radiation.

SUMMARY OF THE INVENTION

A first object of this invention is to provide a method for forming a photolithography mask and pellicle that is suitable for use with incident radiation within a range of wavelengths that extends at least between approximately 250 nm and approximately 150 nm.

A second object of this invention is to provide a method for forming a photolithography mask that can be repaired using standard focused ion beam (FIB) technology without the resultant loss of transmissivity produced in masks of the prior art.

A third object of this invention is to provide a method for forming a photolithography mask pellicle that will not be damaged by radiation within a range of wavelengths that extends at least between approximately 250 nm and approximately 150 nm.

A fourth object of this invention is to provide a method for forming a photolithography mask and pellicle combination wherein said pellicle is a hard pellicle, wherein said mask and pellicle are closely in contact and wherein a bending of the pellicle relative to the mask substrate is avoided.

In accord with the objects of this invention there is provided a method for forming a photolithography mask and pellicle wherein both mask substrate and pellicle are formed of the same transparent hard material, such as fluorine doped silica, which is highly transmissive in the required wavelength range. Further in accord with the objects of the present invention there is provided a method of delineating opaque regions of said mask by patterning and etching a metallic layer such as chromium in a manner as is found in the prior art, but unlike the methods of the prior art said etched metallic layer serves only as a mask for forming the final opaque regions within the transparent material in a completely novel manner. Further in accord with the objects of this invention there is provided a method for forming a photolithography mask wherein the mask repair step is a FIB repair step commonly in use within the practice of the prior art, yet wherein the gallium ion staining, which is disadvantageous in the prior art, is actually used for the process of forming the opaque regions of the mask through the etched metallic regions. Thus, rather than being a detriment to the formation of the mask, the staining process is an advantageous part of its fabrication process. Further in accord with the objects of the present invention and as a part of a second embodiment thereof, there is provided a method of using the FIB repair process to form carbon deposits on the mask for the purpose of forming opaque areas thereon. Yet further in accord with the objects of the present invention, there is provided a method for finally removing those portions of the opaque metallic layer formed upon the transparent mask substrate so that a hard pellicle, formed of the same transparent material of the mask, can be placed against said substrate, aligned with it and be in contact with it, thus eliminating warping of the pellicle and trapping of air beneath the pellicle.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein:

FIG. 10 shows the completed mask with a hard pellicle placed within the boundary region of the mask and fastened in place.

FIGS. 11–13 show prior art usage of gallium ion FIB to remove a defect of extra metal from a photomask. The defect is removed, but the transparent substrate is rendered opaque.

FIGS. 14–16 shows prior art usage of gallium ion FIB to repair a defect of missing metal from a photomask. The metal is replaced by carbon, which can also be deposited in unwanted areas.

FIG. 17 is a processing step in a second embodiment of the invention in which opaque regions will be formed by depositing carbon into trenches formed in the substrate rather than by staining the substrate with gallium ions. This is the process step that immediately follows the steps indicated in FIG. 2–FIG. 5 of the first embodiment. The first 4 steps are identical in each embodiment. In FIG. 20 the exposed transparent substrate is etched to form trenches into which carbon will be deposited.

FIG. 18 shows the structure of FIG. 20 into which carbon has been deposited by FIB in the presence of styrene. The carbon also forms deposits on the neighboring metal surfaces.

FIG. 19 shows the structure of FIG. 21 subsequent to the formation of a layer of photoresist and the development of a portion of the photoresist.

Figure 8:
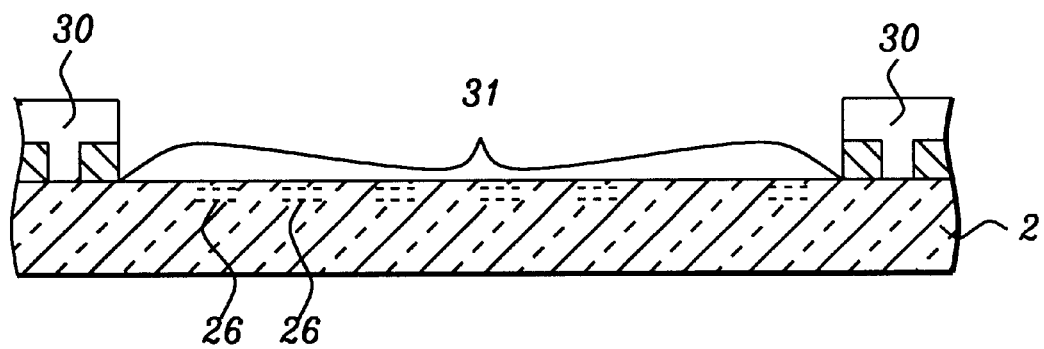
FIG. 8 shows the structure of FIG. 7 subsequent to the developing of the photoresist layer and the removal of the patterned opaque layer.
Figure 9:
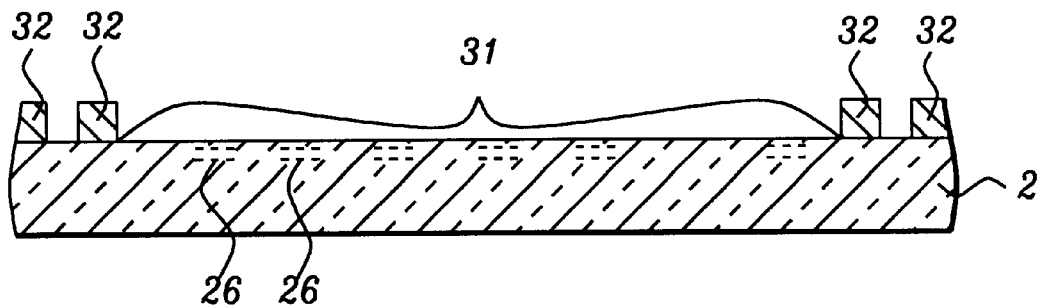
FIG. 9 shows the structure in FIG. 8 with the remaining photoresist stripped away to expose the pellicle-aligning boundary.

The remaining steps of this embodiment are identical to those depicted in FIGS. 8–10, with the exception of the fact that the opaque areas are now carbon filled trenches.

DESCRIPTION OF THE PREFERRED EMBODIMENTS

First Preferred Embodiment

The first preferred embodiment of the present invention provides a method for forming a photomask and hard pellicle suitable for use with incident electromagnetic radiation of 157 nm and less, wherein opaque regions on the photomask are formed by gallium ion staining.

Figure 1:
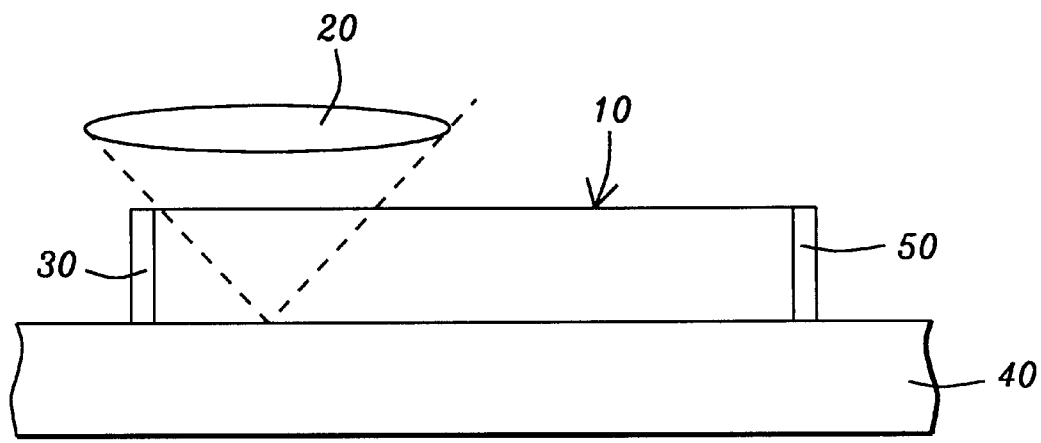
FIG. 1 is a schematic of a prior art pellicle, which is a membrane of organic material stretched over a frame and raised a certain distance from the photomask surface.
Figure 2:
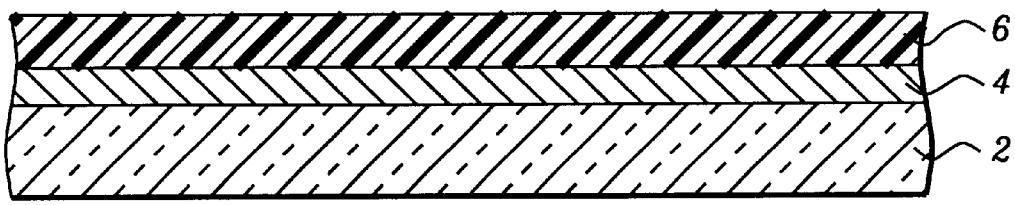
FIG. 2 is a schematic cross sectional view of a photomask substrate (an opaque layer over a transparent layer) over which is a layer of photoresist.

Referring first to FIG. 2, there is shown a schematic cross-sectional drawing of a photomask (photolithographic mask) substrate, comprising a layer that is transparent to a particular wavelength range of incident radiation (2), on which is formed a layer that is opaque to that same range of incident radiation (4). A layer of photoresistive material (photoresist) (6) has been formed to a thickness of approximately 4000 angstroms on the opaque layer (4) of the substrate. For the purposes of this preferred embodiment, the transparent layer (2) can be a layer of fluorine-doped quartz (F-doped quartz) of thickness between approximately 0.600 and 0.700 cm., with approximate thickness 0.635 cm being preferred and the opaque layer (4) can be a layer of chromium (Cr) of thickness between approximately 600 and 800 angstroms, with 700 angstroms being preferred. The suitable range of incident radiation can be electromagnetic radiation of wavelength range that can extend down to less than 157 nm and up to greater than 248 nm, but which typically will lie within that range.

Figure 3:
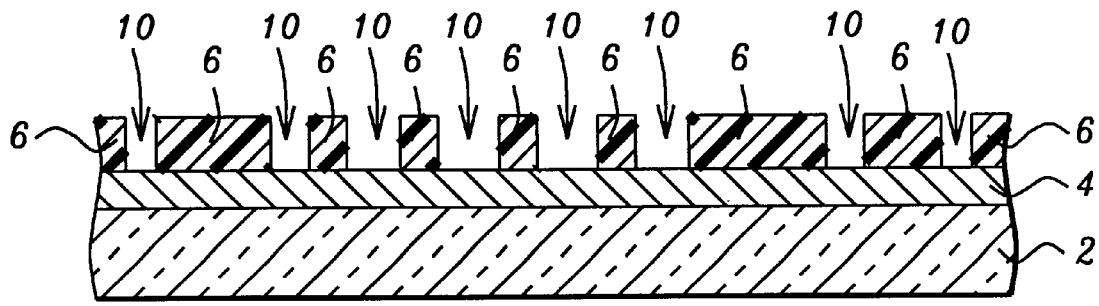
FIG. 3 is the structure of FIG. 1 in which the photoresist layer has been patterned and developed.

Referring next to FIG. 3, there is shown the fabrication of FIG. 2 in which the photoresist layer (6) has been patterned by a method such as electron beam (e-beam) or laser beam writing and the exposed portions have been removed (10) to expose the opaque layer surface (4) thereunder. What is shown is only a representative cross-sectional schematic picture of a device layout that will be transferred to the mask substrate.

Figure 4:
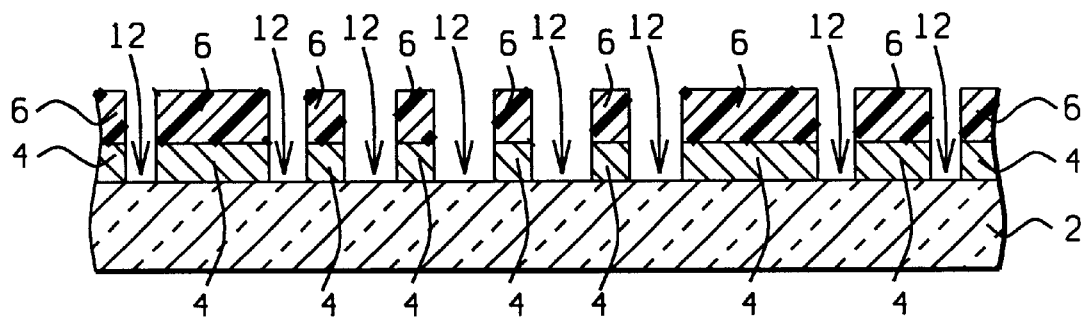
FIG. 4 shows the results of etching the opaque layer through the openings in the photoresist layer in FIG. 2.

Referring next to FIG. 4, there is shown the fabrication of FIG. 3 in which the opaque layer (4) has been etched away (12) in those regions where it has been exposed by the openings in the photoresist. It is understood that the etching may be the result of an isotropic wet etch or an anisotropic plasma etch.

Figure 5:
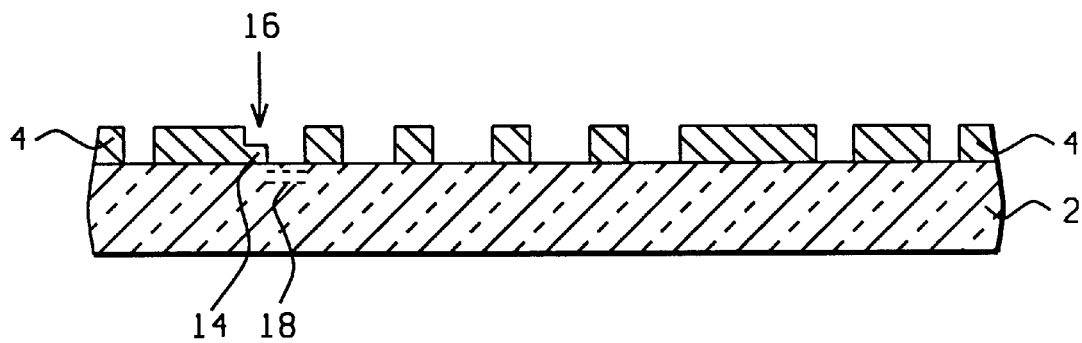
FIG. 5 shows the structure of FIG. 3 subsequent to stripping the photoresist, inspecting the patterned opaque layer for defects and repairing a typical defect.

Referring next to FIG. 5, there is shown the fabrication of FIG. 4 in which the photoresist layer has been completely removed and inspection of the etched opaque layer has been carried out and repairs have been made as necessary. For the purpose of simulating a realistic situation, a small piece of excess opaque material (eg. Cr) is shown (14) being removed by a focused ion beam (FIB) of gallium ions (16). The ion beam leaves a stained region (18), which is shown as shaded, in the transparent layer (the F-doped quartz). This stained region would be of great concern in a fabrication done in accord with the prior art, since the transparent regions must remain transparent for the mask to be usable. In the present invention, however, these regions will become the opaque regions, so that staining during defect repair is not a problem. For a more detailed description of the staining properties of FIB, see FIGS. 12–14 and the related discussion below.

Figure 6:
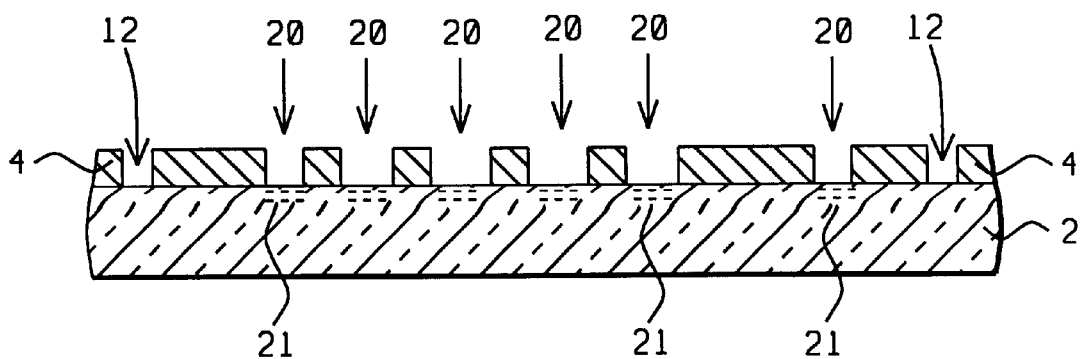
FIG. 6 shows the use of FIB with gallium ions to stain the transparent substrate exposed beneath the etched metallic opaque layer. These stained regions will become the opaque regions of the finished mask.

Referring next to FIG. 6, there is shown the fabrication of FIG. 5 in which all of the open areas in the opaque layer (12) are now used as guides for an intentional gallium ion staining (21) of the transparent layer using an FIB apparatus (the incident FIB beam indicated by arrows (20)). The FIB dosage must be sufficient to render the transparent layer substantially opaque. A dose rate of greater than 1.5 J/cm$^2$ is found to be adwquate for this purpose. This use of FIB for forming the opaque portions of a mask pattern is one of the novelties of the present invention and is not to be confused with the prior art use of FIB merely to repair defects in an opaque layer. In the present invention, gallium ions are applied to all exposed areas of the transparent layer, whether repairs have been carried out there or not.

Figure 7:
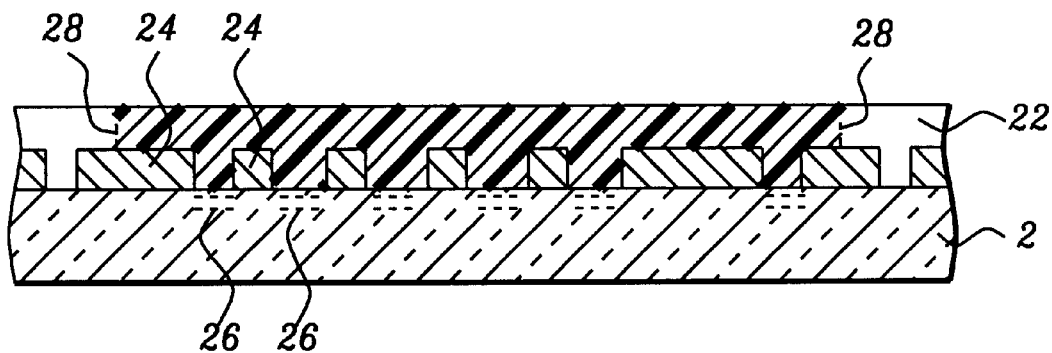
FIG. 7 shows the structure of FIG. 5 subsequent to a coating with a second photoresist layer, which layer has been patterned to delineate boundary regions on the mask.

Referring next to FIG. 7, there is shown the fabrication of FIG. 6 in which a second layer of photoresist (22) is formed over the patterned opaque layer (24) and the exposed, stained regions (26) of the otherwise transparent layer. The layer of photoresist is then exposed by a method such as e-beam writing or laser beam writing to define a region (28) which will form an aligning boundary for the pellicle.

Referring next to FIG. 8, there is shown the fabrication of FIG. 7 in which the exposed region ((28) in FIG. 7) of the photoresist layer has been developed and removed and the remaining portions of the opaque (Cr) layer have also been removed from over the transparent layer to uncover a substantial region (31). This uncovered patterned region of the transparent layer will form the photomask. An unexposed region (30) of photoresist, which is generally peripherally disposed about the exposed and removed region (31) remains. This region will delineate an alignment boundary.

Referring next to FIG. 9, there is shown the fabrication of FIG. 8 in which the unexposed regions (30) of the photoresist layer are now stripped away to expose a peripherally disposed remaining portion (32) of the opaque layer that will serve as an aligning boundary for the pellicle. The photomask region (31), within the peripheral aligning boundary, will be covered by the pellicle.

Referring next to FIG. 10, there is shown the fabrication of FIG. 9 on which a fabricated pellicle (34) has been placed. The pellicle is formed of the same transparent material as the transparent layer of the photomask, which in the present embodiment can be F-doped quartz. It is another feature of the present invention that the aligned hard pellicle is kept in contact with the surface of the photomask and, in that way, bending or warpage of the pellicle is eliminated and air is not trapped beneath it. It can also be noted that the photomask is sufficiently robust so that it can be used without a protective pellicle, since the opaque regions are within the transparent layer and are not layers of opaque material over the transparent layer which are subject to damage.

Second Preferred Embodiment

The second preferred embodiment of the present invention provides a method for forming a photomask and hard pellicle suitable for use with incident electromagnetic radiation of 157 nm and less, wherein opaque regions on the photomask are formed by the deposition of carbon atoms within trenches formed in the transparent substrate. The method used to produce the necessary carbon deposition in the present invention is similar to that used to repair defects in the chromium portions of a mask formed using the methods of the prior art. The following figures illustrate the defect repair mechanism of the prior art as a means of clarifying the method of the present invention. In addition, the nature of the present invention is such that when repairs to the opaque chromium regions become necessary, they will only produce staining within regions of the transparent substrate that will be rendered opaque as a part of the invention.

The following figures are meant to schematically indicate how FIB with a gallium ion beam is used in the prior art to repair defects in an opaque layer. FIGS. 11–13 show the use of FIB to remove excess portions of the opaque layer, which is a chromium layer in this example. This can be called FIB milling. FIGS. 14–16 show the use of FIB to add an opaque region by carbon deposition where it was erroneously removed when the chromium layer was etched.

Referring first to FIG. 11, there is shown a schematic overhead view of a portion of a chromium opaque layer (2) on which there is an unwanted extension (4).

Referring next to FIG. 12, there is shown a side view in which that extension (4) is being milled by a gallium-ion beam (6).

Finally, FIG. 13 shows the successful removal of the extension, but there is a stained region of the quartz (8) underneath the removed chromium. In a prior art mask, this stained region would be within the transparent portion of the mask, thereby destroying its transmissive properties. In the method of the present invention, the production of such a stained region would not be disadvantageous since it would be within the portion of the mask to be rendered opaque.

Referring now to FIG. 14, there is shown a schematic overhead view of a portion of a chromium opaque layer (10), similar to that in FIG. 12, except that now there is a missing piece (shown in broken lines) of chromium (12).

Referring next to FIG. 15 there is shown a side view of the structure of FIG. 15 in which a gallium ion FIB beam (13) is being aimed at the region of missing chromium in the presence of styrene molecules (14) that are being bled into the area. The interaction of the Ga ions (13) with the styrene (14) causes the deposition of carbon atoms (16).

Referring next to FIG. 16, there is shown the result of the FIB-styrene interaction, wherein the missing chromium piece has been replaced by a carbon piece (16) of the same size and shape. The surrounding transparent layer is unaffected by this process.

The initial process steps of the present invention which comprises the second preferred embodiment are identical to that depicted in FIGS. 2–4 of the first preferred embodiment and can be referred to above in the discussion of those figures. The continuation of the process differs after the schematic of FIG. 4 and the first process step which is different is shown in FIG. 17.

Referring, then, to FIG. 17, there is shown a dry etching process penetrating the exposed portions of the surface of the transparent layer (2) (an F-doped quartz surface in this embodiment) that had previously been exposed by the etching of the opaque layer (Cr layer (4)) in FIG. 4. Note that remnants of the photoresist ((6) in FIG. 4) have been removed. The etching produces trenches (50) in the transparent layer. The depth of the trenches is not critical since the carbon deposition is highly absorptive.

Referring next to FIG. 18, there is shown the deposition of carbon atoms within the trenches (52) and also, unavoidably, on neighboring surfaces of the opaque layer (54) where it will do no harm. The mechanism for the deposition of carbon is to be understood in terms of the description associated with FIG. 15 (gallium ions deposited by FIB in the presence of styrene molecules). Note that no carbon has been deposited in the trench regions of the opaque layer (56) that will serve as alignment boundaries.

Referring next to FIG. 19, there is shown the fabrication of FIG. 21 over which a photoresist layer (58) has been formed and has been exposed in the mask region (between vertical broken lines (60)), but not the alignment boundary region (62).

The remainder of the process of the second embodiment is identical to that shown in FIGS. 8–10 of the first embodiment and described above.

As is understood by a person skilled in the art, the preferred embodiment of the present invention is illustrative of the present invention rather than limiting of the present invention. Revisions and modifications may be made to methods, materials, structures and dimensions employed in the present method of fabricating a photomask and pellicle suitable for use in photolithography with electromagnetic radiation within a range of wavelengths that extends at least between approximately 250 nm and approximately 150 nm, while still being in accord with the spirit and scope of the present invention as defined by the appended claims.

What is claimed is:

1. A method for forming a photolithographic mask and pellicle comprising:
   providing a substrate comprising a transparent layer over which is formed an opaque layer, said layers being respectively transparent and opaque to a preselected range of wavelengths;
   transferring a mask pattern to the opaque layer of said substrate by removing pattern shaped portions from said opaque layer, thereby exposing corresponding surface portions of said transparent layer beneath said opaque layer;
   inspecting said patterned opaque layer and repairing any discovered defects using a focused ion-beam repair method;
   transferring said mask pattern to said transparent layer by applying said focused ion-beam, through said patterned opaque layer, to said exposed surface portions of said transparent layer, thereby staining a bulk portion of said transparent layer beneath said exposed surfaces and rendering said bulk portion opaque to said preselected range of radiation wavelengths;
   removing at least the portion of said opaque material layer remaining over said patterned transparent layer, leaving behind a peripherally disposed portion to serve as an alignment boundary for a pellicle, the exposed portion of said transparent layer forming thereby a photolithographic mask.

2. The method of claim 1 wherein the removal of portions of said opaque layer is by etching said opaque layer through a mask formed of photoresistive material which is patterned by e-beam or laser writing.

3. The method of claim 2 wherein the layer of transparent material is a layer of material chosen from among the group of materials transparent to electromagnetic radiation of wavelength range extending from above 250 nm to below 150 nm.

4. The method of claim 2 wherein the layer of transparent material is a layer of fluorine-doped quartz, formed to a thickness between approximately 0.6 and 0.7 cm.

5. The method of claim 1 wherein the layer of opaque material is a layer of material chosen from among the group of materials opaque to electromagnetic radiation of wavelength range extending from above 250 nm to below 150 nm.

6. The method of claim 4 wherein the layer of opaque material is a layer of chromium formed to a thickness of between approximately 600 and 800 angstroms.

7. The method of claim 6 wherein the photoresistive layer is patterned by exposure to an e-beam or a laser beam.

8. The method of claim 1 wherein the method used to etch the layer of opaque material is an isotropic etch or an anisotropic etch.

9. The method of claim 8 wherein the isotropic etch is a chemical wet etch and wherein the anisotropic etch is a plasma assisted etch.

10. The method of claim 1 wherein the focused ion-beam (FIB) method uses a focused beam of singly positive gallium ions which are deposited at a deposition rate greater than 1.5 J/cm$^2$.

11. The method of claim 1 further comprising the formation of a pellicle of the same transparent material as the transparent layer of the mask substrate and the placing of said pellicle within the alignment boundary of said photomask.

12. A method for fabricating a photomask and pellicle comprising:
   providing a substrate comprising a transparent layer over which is formed an opaque layer, said layers being respectively transparent and opaque to a preselected range of wavelengths;
   transferring a mask pattern to the opaque layer of said substrate by removing pattern shaped portions from said opaque layer, thereby exposing corresponding surface portions of said transparent layer beneath said opaque layer;
   inspecting said patterned opaque layer and repairing any discovered defects using a focused ion-beam repair method;
   etching trenches in the transparent material layer through said pattern shaped portions in the opaque layer;
   using a focused ion-beam method as a means for filling each of said trenches with a deposition of carbon atoms sufficient to render said trenches opaque;

removing at least the portion of said opaque material layer remaining over said patterned transparent layer, leaving behind a peripherally disposed portion to serve as an alignment boundary for a pellicle, the exposed portion of said transparent layer forming thereby a photolithographic mask.

13. The method of claim 1 wherein the removal of portions of said opaque layer is by etching said opaque layer through a mask formed of photoresistive material which is patterned by e-beam or laser writing.

14. The method of claim 13 wherein the layer of transparent material is a layer of material chosen from among the group of materials transparent to electromagnetic radiation of wavelength range extending from above 250 nm to below 150 nm.

15. The method of claim 14 wherein the layer of transparent material is a layer of fluorine-doped quartz, formed to a thickness of between approximately 0.600 and 0.700 cm.

16. The method of claim 15 wherein the layer of opaque material is a layer of material chosen from among the group of materials opaque to electromagnetic radiation of wavelength range extending from above 250 nm to below 150 nm.

17. The method of claim 16 wherein the layer of opaque material is a layer of chromium formed to a thickness of between approximately 600 and 800 angstroms.

18. The method of claim 17 wherein the method used to etch the layer of opaque material is an isotropic etch or an anisotropic etch.

19. The method of claim 18 wherein the isotropic etch is a chemical wet etch and the anisotropic etch is a plasma assisted etch.

20. The method of claim 19 wherein said layer of transparent material is etched with an isotropic chemical wet etch.

21. The method of claim 20 wherein the focused ion-beam method comprises application of a focused beam of singly positive gallium ions which are deposited at a deposition rate greater than 1.5 J/cm$^2$ in the presence of styrene molecules, producing thereby a deposition of carbon atoms.

22. The method of claim 21 further comprising the formation of a pellicle of the same transparent material as the transparent layer of the mask substrate and the placing of said pellicle within the alignment boundary of said photomask.

23. A photomask to be used in photolithography for transferring a mask pattern by means of incident electromagnetic radiation within a preselected range of wavelengths comprising:

a layer of material transparent to said preselected range of wavelengths, in which is formed, in the mask pattern to be transferred or its complement, regions opaque to the transmission of incident electromagnetic radiation of said preselected wavelength range, said opaque regions being regions of the transparent material stained by the deposition of singly positive gallium ions;

a raised alignment boundary on said layer peripherally disposed about said mask pattern.

24. The fabrication of claim 23 wherein the layer of transparent material is a layer of material chosen from among the group of materials transparent to electromagnetic radiation of wavelength range extending from above 250 nm to below 150 nm.

25. The fabrication of claim 24 wherein the layer of transparent material is a layer of fluorine-doped quartz, formed to a thickness of between approximately 0.600 and 0.700 cm.

26. The fabrication of claim 23 further comprising a pellicle formed of the same material as that of the transparent material layer, said pellicle being placed over said photomask within said alignment boundary.

27. A photomask and pellicle to be used in photolithography for transferring a mask pattern by means of incident electromagnetic radiation within a preselected range of wavelengths comprising:

a layer of material transparent to said preselected range of wavelengths, in which are formed, in the mask pattern to be transferred or its complement, regions opaque to the transmission of incident electromagnetic radiation of said preselected wavelength range, said opaque regions being trenches formed within the transparent material and filled by carbon atoms;

a raised alignment boundary peripherally disposed about said mask pattern.

28. The fabrication of claim 27 wherein the layer of transparent material is a layer of material chosen from among the group of materials transparent to electromagnetic radiation of wavelength range extending from above 250 nm to below 150 nm.

29. The fabrication of claim 28 wherein the layer of transparent material is a layer of fluorine-doped quartz, formed to a thickness of between approximately 0.600 and 0.700 cm.

30. The fabrication of claim 27 wherein the carbon atoms are deposited by the action of a focused ion beam interacting with styrene molecules.

31. The fabrication of claim 30 further comprising a pellicle formed of the same material as that of the transparent material layer, said pellicle being placed over said photomask within said alignment boundary.

* * * * *